United States Patent
Hung et al.

(10) Patent No.: US 6,391,786 B1
(45) Date of Patent: *May 21, 2002

(54) ETCHING PROCESS FOR ORGANIC ANTI-REFLECTIVE COATING

(75) Inventors: Jeffrey Hung, San Jose; Brian Lee, Saratoga, both of CA (US)

(73) Assignee: Lam Research Corporation, Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 47 days.

(21) Appl. No.: 09/002,007

(22) Filed: Dec. 31, 1997

(51) Int. Cl.$^7$ .............................................. H01L 21/302
(52) U.S. Cl. ...................... 438/706; 438/710; 438/711; 438/712; 438/714
(58) Field of Search ................................ 438/706, 710, 438/711, 712, 715, 720, 722, 725; 252/79.3

(56) References Cited

U.S. PATENT DOCUMENTS

| | | | | |
|---|---|---|---|---|
| 4,910,122 A | * | 3/1990 | Arnold et al. ............... | 430/313 |
| 5,126,289 A | * | 6/1992 | Ziger et al. .................. | 438/671 |
| 5,256,564 A | | 10/1993 | Narita ......................... | 437/195 |
| 5,269,879 A | | 12/1993 | Rhoades et al. ............ | 156/643 |
| 5,308,742 A | * | 5/1994 | Ta ............................... | 430/313 |
| 5,316,980 A | * | 5/1994 | Takeshiro ................... | 437/228 |
| 5,437,961 A | | 8/1995 | Yano et al. .................. | 430/316 |
| 5,443,941 A | * | 8/1995 | Bariya et al. ................ | 430/313 |
| 5,445,710 A | | 8/1995 | Hori et al. ............... | 156/643.1 |
| 5,486,493 A | | 1/1996 | Jeng ............................ | 437/195 |
| 5,508,881 A | | 4/1996 | Stevens ...................... | 361/305 |
| 5,514,247 A | * | 5/1996 | Shan et al. ............... | 156/643.1 |
| 5,529,657 A | * | 6/1996 | Ishii ............................ | 156/345 |
| 5,554,560 A | * | 9/1996 | Hsue et al. .................. | 438/443 |
| 5,591,480 A | | 1/1997 | Weisman et al. ............. | 216/13 |
| 5,591,677 A | | 1/1997 | Jeng ............................ | 437/195 |
| 5,635,337 A | | 6/1997 | Bartha et al. ................ | 430/323 |
| 5,639,389 A | | 6/1997 | Schmidt et al. ................ | 216/18 |
| 5,641,610 A | | 6/1997 | Bartha et al. ................ | 430/313 |
| 5,655,110 A | | 8/1997 | Krivokapic et al. ......... | 395/500 |
| 5,753,418 A | * | 5/1998 | Tsai et al. .................... | 438/713 |
| 5,883,007 A | * | 3/1999 | Abraham et al. ........... | 438/714 |
| 5,919,599 A | * | 7/1999 | Meador et al. ........... | 430/271.1 |
| 5,980,768 A | * | 11/1999 | Abraham ...................... | 216/67 |

FOREIGN PATENT DOCUMENTS

| | | |
|---|---|---|
| EP | 0 407 169 | 1/1991 |
| WO | WO97/07145 | 2/1997 |

OTHER PUBLICATIONS

"Dry Etching of Bottom Anti-Reflective-Coat and its Application to Gate Length Control", A. Nishizawa, et al., IEEE International Symposium on Semiconductor Manufacturing Conference Proceedings, XP-002099210, Oct. 6-8, 1997, pp. F13-F16.

Silicon Processing for the VLSI Era, Stanley Wolf et al., 1987, Process Technology, Lattice Press, Sunset Beach, CA, vol. 1, pp. 438-441.

* cited by examiner

Primary Examiner—Benjamin L. Utech
Assistant Examiner—Lan Vinh
(74) Attorney, Agent, or Firm—Burns, Doane, Swecker & Mathis, LLP

(57) ABSTRACT

A process for selectively removing an anti-reflective coating (ARC) in the manufacturing of semiconductor integrated circuits using an oxygen-free plasma of one or more fluorine containing compounds, chlorine and an optional inert carrier gas. The process renders effective etching of the anti-reflective coating while maintaining dimensional control of a previously etched photoresist.

18 Claims, 2 Drawing Sheets

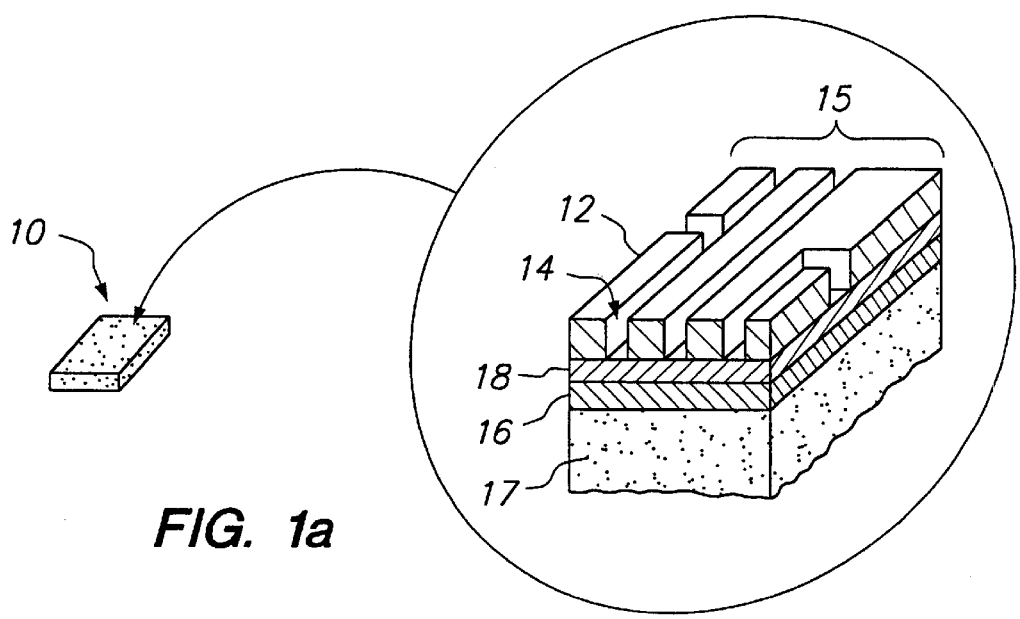
FIG. 1a
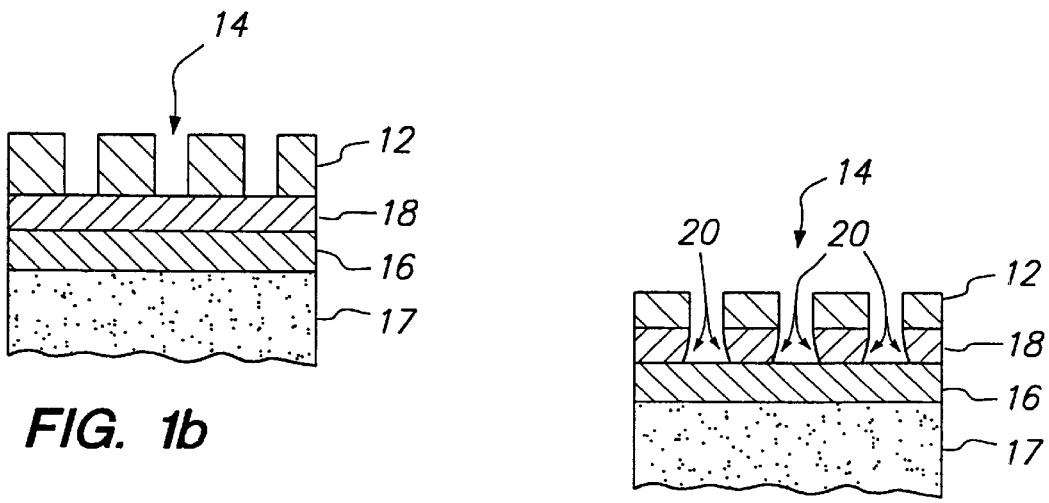
FIG. 1b
FIG. 2
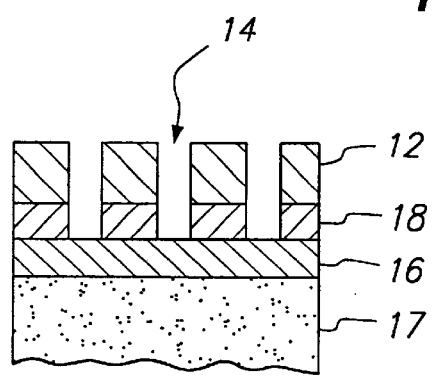
FIG. 3

ETCHING PROCESS FOR ORGANIC ANTI-REFLECTIVE COATING

FIELD OF THE INVENTION

The present invention relates to an improved method for etching organic anti-reflective coatings (ACR's) in the fabrication of integrated circuits.

BACKGROUND OF THE INVENTION

Electronic, solid state microchips such as those in computer microprocessors, hold thousands of individual systems each of which is made up of thousands of individual electronic components such as transistors, resistors, and capacitors. The manufacture of solid state electronic devices relies on assembling layers of semiconducting, conducting, and insulating materials in precise patterns and uniform thicknesses, selectively etched to create electronic components and systems according to the functions desired. Because the components and systems are all made into one chip, or substrate, and interconnected, these circuits are appropriately termed "integrated circuits."

The production of integrated circuits is highly competitive. Therefore improving the efficiency of the manufacturing steps means a competitive advantage. Typically, the production of integrated circuits requires fabricating one or more networks of conductive pathways interconnecting the components to form systems and interconnecting the systems to form circuits. An important manufacturing step is the formation of a network of conducting pathways, or interconnecting network, over a semiconducting substrate via photolithography and etching (collective these processes are referred to "patterning"). This is typically accomplished by coating a conductive, metallic layer, with a light sensitive coating, i.e., a photoresist coating ("photoresist"). The photoresist is then exposed to actinic light through a mask which blocks the light in a pattern corresponding to the pattern desired for the conducting interconnecting network.

The photoresist coating is subsequently "developed," that is, the parts of the photoresist coating which were exposed to the actinic light are selectively removed, thereby exposing the conductive surface below in a pattern corresponding to the openings in the mask. Usually the exposed metal layer is removed by plasma etching, but may also be removed by wet chemical etching, leaving the desired interconnecting network.

The demand in recent years for greater miniaturization of integrated circuits has led to increased circuit density, which requires shorter wavelength light such as deep ultraviolet (UV) to expose the photoresist. While the short wavelength light theoretically should yield exposures of high resolution, unfortunately it tends to reflect off the metallic layer back through the photoresist layer. This reflection sets up interference with the incoming light which reduces resolution. A discussion of this phenomenon can be found in *Silicon Processing for the VLSI Era*, S. Wolf, et al., v. 1, "Process Technology," Lattice Press, Sunset Beach, Calif. (1987). To solve this problem, an anti-reflective coating (ARC) is typically deposited on the metallic layer before the photoresist layer to reduce the unwanted reflection and consequential loss of resolution. The ARC's widely used in the integrated circuit industry are polyimides although other organic anti-reflective material can be used.

After the photoresist has been exposed to UV and developed, the ARC must be removed by etching to uncover the underlying conductive, metallic layer or coating. The prior art teaches that this may be done by plasma etching. However, a system of etching agents and conditions must be used which effectively etch away the ARC but leave the photoresist relatively intact.

U.S. Pat. No. 5,655,110, "Krivokapic et al.," incorporated herein by reference, discusses the importance of maintaining critical dimensions during etching operations in mass produced semiconductor wafers. U.S. Pat. No. 5,126,289, "Ziger," teaches a method of etching the photoresist layer and the underlying aluminum layer in one operation using ionized carbon tetrachloride as the etching agent. However, Ziger is silent regarding degradation of the photoresist.

Thuy B. Ta in U.S. Pat. No. 5,308,742 ("Ta"), incorporated herein by reference, claims a method of manufacturing an integrated circuit which includes a step of plasma etching a polyimide ARC using trifluoromethane ($CHF_3$) and elemental oxygen ($O_2$) with argon as a carrier gas. This patent asserts that $CHF_3$ promotes polymer formation while the argon acts as a sputter component which removes the polymer formed by $CHF_3$. The sputter component travels primarily in a vertical direction so that the polymeric material on the sidewalls of the interconnecting network etched through the photoresist is not removed. This protects the sidewalls of the photoresist from lateral attack by oxygen. Purportedly, this method provides critical dimension control because it is selective for the ARC.

In Ta, oxygen appears to be the actual etching agent. Oxygen is an aggressive oxidizing agent and tends to be non-specific and detrimental to some solid state components. A milder oxidizing agent would offer greater selectivity between the ARC and the photoresist, and hence, an improvement over the process of Ta. Selectivity is important because the $CHF_3$ would not provide protection in the vertical direction if Ar sputtering removes $CHF_3$ deposited on top of the photoresist. Excessive erosion impairs the photoresist's masking properties during the etching of the ARC and/or underlying conductive coating.

We have found an improved process for selectively and effectively removing an ARC without the use of oxygen, thus, reducing degradation of the photoresist.

SUMMARY OF THE INVENTION

A first aspect of the present invention is a process for etching an organic ARC on a metallic substrate comprising exposing the ARC to a system of etching agents in an ionized state in a reaction chamber of a plasma generating device, the system of etching agents including one or more fluorine-containing compounds, an inert carrier and chlorine. This process is particularly useful for preserving the critical dimensions of a photoresist while removing exposed areas of an organic ARC during the manufacturing of an integrated circuit.

A second aspect is a formulation of one or more fluorine-containing compounds, an inert carrier gas and chlorine which is employed in the process of the first aspect. In one embodiment of the formulation, the fluorine-containing compound is selected from the group consisting of $CF_4$, $CHF_3$, $C_2F_6$, $CH_2F_2$, $SF_6$, $C_nF_{n+4}$. In a particular embodiment the fluorine-containing compound is $CHF_3$ and the inert carrier is argon.

BRIEF DESCRIPTION OF THE DRAWINGS

FIG. 1*a* is a schematic, perspective view of a portion of a semiconductor composite chip after the photoresist coating has been etched but before the ARC has been removed.

FIG. 1*b* is a schematic cross sectional view of the portion of the chip shown in FIG. 1*a*.

FIG. 2 is a view similar to FIG. 1a. after the ARC has been removed by a process using $O_{02}$.

FIG. 3 is a view similar to FIG. 1a. after the ARC has been removed by the process of the present invention.

DETAILED DESCRIPTION OF THE PREFERRED EMBODIMENTS

Figure 4:
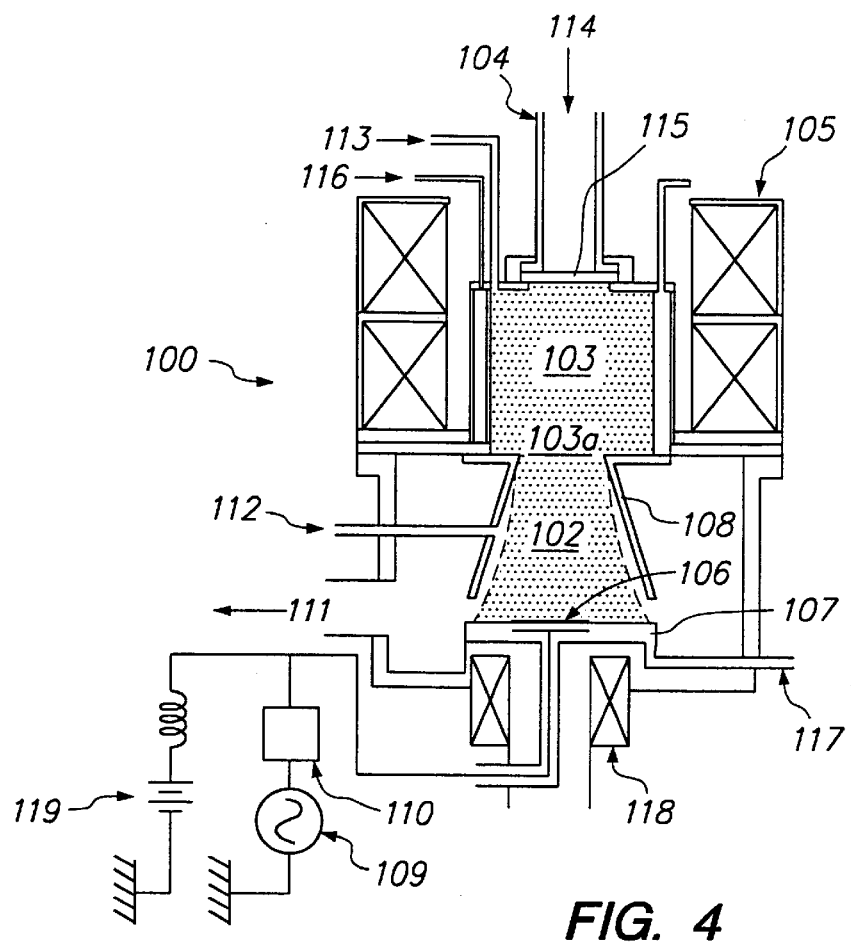
FIG. 4 is a schematic view of a high density plasma ECR reactor which can be used to carry out the process according to the invention.

Referring to FIG. 1a, a perspective view of a greatly magnified section of a semiconductor composite chip 10 during manufacturing after the photoresist 12 has been exposed and developed, shows the interconnecting network 14 forming the circuit pattern 15. That is, the area of the conductive coating 16 corresponding to those portions of the photoresist not exposed, will become the network of conductive pathways interconnecting the components and systems. The conductive coating or layer covers a semiconductor base 17. FIG. 1b, a cross sectional view corresponding to FIG. 1a, more clearly shows that after the photoresist is developed, part of the ARC 18 covers the bottom of the interconnecting network 14. This part of the ARC must be removed before the underlying conductive coating 16 can be removed by etching.

Note in FIG. 1a and FIG. 1b that the interconnecting network 14 formed by exposure and development of the photoresist 12 are clean and precise. However, if the system of agents used for removing the ARC at the bottom of the interconnecting network 14 attacks the non-etched parts of the photoresist 12, the precision of the interconnecting network 14 may be seriously degraded.

In previous generations of integrated circuits, the conductive pathways formed by etching the conductive coating were relatively well separated so that some degradation of photoresist could generally be tolerated. However, in the present generation of integrated circuits, the conductive pathways are often so close together that even a small amount of degradation can be critical. Further, in order to achieve high resolution during exposure and development of deep UV photoresists, the thickness of the photoresist has been reduced from around 12000 Å to around 7000 to 8000 Å. This leaves less photoresist to protect the underlying layers during etching of the ARC.

FIG. 2 is a schematic illustration of the results of removing the ARC with a system of agents containing $O_2$ ionized in a plasma generating chamber. For example, a system which employs a mixture of $O_2$ and $N_2$. While this system of agents containing $O_2$ effectively removes the ARC they also attack the photoresist 12 causing general thinning and degradation indicated as points 20 in FIG. 2. As illustrated in FIG. 2, the degradation reduces the precision of the interconnecting network 14 and can cause undesirable exposure of the underlying layers at other locations. Because the interconnecting network 14 controls what is etched away from the conductive coating, thinning and degradation can cause voids in the conducting pathways or faulty connections leading to errors in the function of the integrated circuit.

FIG. 3 is a schematic illustration of the results of removing the ARC with a system of agents of the present invention. Note that the photoresist 12 has been only minimally affected and retains its precision pattern. Therefore, the precision pattern will be transferred to the formation of conductive pathways in the next step when the exposed conductive coating 16 is etched away.

For the present process, the carrier gas is an inert, noble gas, preferably argon (Ar), although, other noble gases such as helium, neon, krypton, xenon or mixture thereof may be used. The source of chlorine preferably is chemically pure elemental chlorine ($Cl_2$). Alternatively, it is possible to use another chlorine containing gas such as HCl or $BCl_3$. Similarly, while $CHF_3$ is the preferred source of fluorine, other fluorocarbon gases or combination of such gases may be used.

FIG. 4 shows an ECR reactor 100 which can process a substrate with a high density plasma. The reactor includes a reaction chamber 102 wherein a substrate is subjected to treatment with a plasma gas. In order to generate the high density plasma, the reactor includes a plasma generating chamber 103 wherein a high density plasma is generated by the combination of microwave energy transmitted through microwave guide 104 and magnetic energy generated by electromagnetic coils 105. The high density plasma can be generated from a suitable gas or gas mixture and an ion beam is extracted from the plasma chamber through orifice 103a. If desired, the orifice 103a can have the same diameter as the chamber 103. A substrate 106 is supported on a substrate support 107 such as an electrostatic chuck having a substrate temperature controlling mechanism associated therewith.

The high density plasma generated in chamber 103 can be confined within horn 108 by electromagnetic coils 118 and directed to the substrate 106 by applying an RF bias to the substrate by means of an RF source 109 and associated circuitry 110 for impedance matching, etc. The reaction chamber 102 is evacuated by a suitable vacuum arrangement represented generally by the evacuation port 111. In order to introduce the etch reactants into the high density plasma, the horn 118 can include one or more gas injection arrangements such as gas distributing rings on the inner periphery thereof whereby reactants such as F and Cl can be introduced into the high density plasma. The reactant or reactants can be supplied through one or more passages represented generally at 112. In order to produce a plasma in plasma generating chamber 103, argon can be introduced into the plasma generating chamber 103 by one or more passages represented generally at 113.

Microwave energy represented by arrow 114 travels through dielectric window 115 and enters the plasma generating chamber 103, the walls of which are water cooled by water supply conduit 117. Electromagnetic coils 118 below substrate holder 107 can be used for shaping the magnetic field in the vicinity of the substrate 106. A DC power source 119 provides power to the substrate holder 107 for electrostatically clamping substrate 106.

Figure 5:
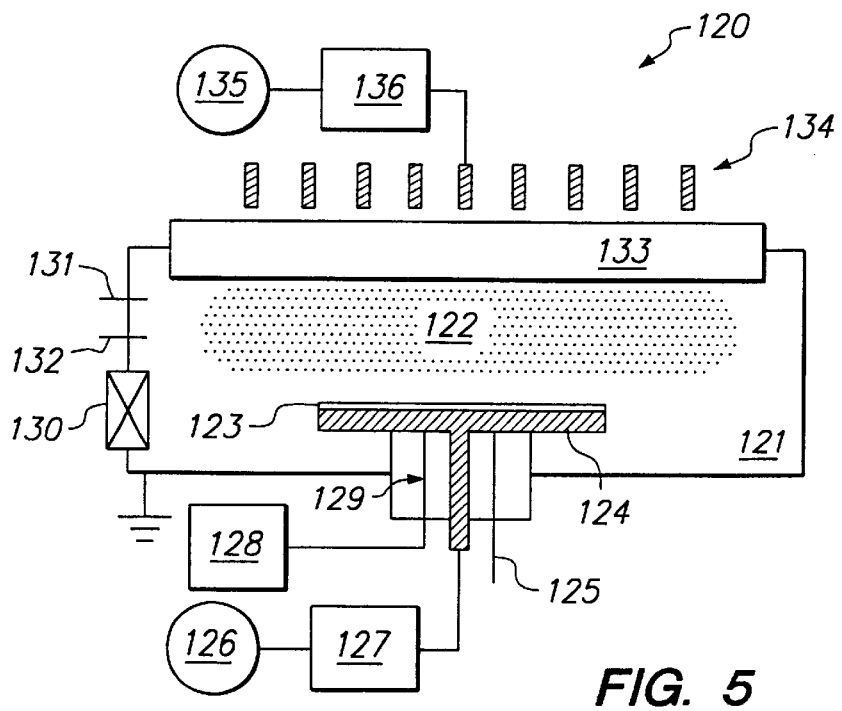
FIG. 5 is a schematic of a high density plasma TCP™ reactor which can be used to carry out the process according to the invention.

FIG. 5 shows a TCP™ reactor 120 which can process substrates with high density plasma. The reactor includes a process chamber 121 in which plasma 122 is generated adjacent substrate 123. The substrate is supported on water cooled substrate support 124 and temperature control of the substrate is achieved by supplying helium gas through conduit 125 to a space between the substrate and the substrate support. The substrate support can comprise an aluminum electrode or a ceramic material having a buried electrode therein, the electrode being powered by an RF source 126 and associated circuitry 127 for providing RF matching, etc. The temperature of the substrate during processing thereof is monitored by temperature monitoring equipment 128 attached to temperature probe 129. A similar temperature monitoring arrangement can also be used in the ECR reactor shown in FIG. 4.

In order to provide a vacuum in chamber 121, a turbo pump is connected to outlet port 130 and a pressure control valve can be used to maintain the desired vacuum pressure. Process gas containing F, Cl and an optional inert gas such as Ar can be supplied into the chamber by conduits 131, 132 which feed the reactant gases to a gas distribution ring extending around the underside of dielectric window 133. Alternatively, the process gases can be supplied through a dielectric showerhead window or other suitable gas distribution system. An inductive energy source such as an antenna in the form of a spiral TCP™ coil 134 located outside the chamber in the vicinity of the window is supplied RF power by RF source 135 and associated circuitry 136 for impedance matching, etc. When a substrate is processed in the chamber, the RF source 135 supplies the TCP™ coil 134 with a RF current at 13.56 MHz and the RF source 126 supplies the lower electrode with RF current at 400 kHz.

The present process is carried out in an ECR or TCP™ reactor of the type described above or in any suitable reaction chamber of a plasma generator. The ARC can be on a semiconductor substrate such as a semiconductor wafer, flat panel display, etc. The process may be carried out within the following window:

Pressure—about 0.1 to a bout 500 millitorr
Temperature—about 0° to about 100° C.
$Cl_2$ flow—about 2.5 to about 200 sccm
Inert gas flow—0 to about 200 sccm
Fluorine containing compound gas flow—about 5 to about 200 sccm preferably it is carried out within the following window:

Pressure—about 1 to about 100 millitorr
Temperature—about 30° to about 80° C.
$Cl_2$ flow—about 5 to about 60 sccm
Ar flow—about 5 to about 80 sccm
$CHF_3$ flow—about 5 to about 80 sccm Process time varies with the composition and proportions of the reactants, and more importantly, the thickness of the organic ARC. The end point of the process, i.e., when all of the exposed ARC has been removed, can be determined by standard methods of this art using standard micro chip manufacturing equipment. For example, one may monitor an optical signal or the concentration of fluorine.

Although the present invention has been illustrated by reference to particular embodiments, those skilled in the art of integrated circuit production will appreciate variations of these embodiments may still be within the scope of the invention.

What is claimed is:

1. A process for removing exposed areas of an organic ARC on a metallic layer, the exposed areas of the ARC having been exposed by previously etching a photoresist covering the ARC, the processing comprising exposing the exposed areas of the ARC to an oxygen-free system of etching agents in an ionized state in a reaction chamber of a plasma generating device, the system of etching agents being nitrogen-free and including one or more fluorine containing compounds, chlorine and an optional inert carrier gas.

2. The process of claim 1, wherein the one or more fluorine-containing compounds is selected from the group consisting of $CF_4$, $CHF_3$, $C_2F_6$, $CH_2F_2$, $SF_6$, and $C_nF_{n+4}$.

3. The process of claim 1, wherein the plasma generating device is evacuated to a pressure below 100 mTorr while etching the ARC with the etching agents.

4. The process of claim 1, wherein the plasma generating device comprises an ECR reactor and the ARC is on a semiconductor substrate.

5. The process of claim 1, wherein the ARC is on a semiconductor wafer.

6. The process of claim 1, wherein the plasma is generated adjacent a substrate including the ARC, the plasma generating device including a dielectric window facing the substrate and an antenna outside the reaction chamber, the antenna forming the plasma by inductively coupling radio frequency energy through the dielectric window and into the reaction chamber.

7. The method of claim 1, wherein the organic ARC consists essentially of polyimide.

8. The method of claim 1, wherein the plasma generating device is evacuated to a pressure below 40 mTorr while etching the ARC with the etching agents.

9. The process of claim 1, wherein the ARC is exposed by channels forming a circuit pattern previously etched in the photoresist covering the ARC.

10. The process of claim 9, wherein the ARC on the metallic layer has been used to prevent actinic light passing completely through the photoresist from being reflected from the metallic layer back through the photoresist during the exposure process.

11. The process of claim 1, wherein the system of etching agents consists essentially of $CHF_3$, Ar, and $Cl_2$.

12. The process of claim 11, carried out within the following window:

Pressure—about 1 to about 100 millitorr
Temperature—about 30° to about 80° C.
$Cl_2$ flow—about 5 to about 60 sccm
Ar flow—about 5 to about 80 sccm
$CHF_3$ flow—about 5 to about 80 sccm.

13. A method for substantially preserving a photoresist while removing exposed areas of an organic ARC during the manufacturing of an integrated circuit comprising exposing the ARC to an oxygen-free system of etching agents, in an ionized state in a reaction chamber of a plasma generating device, the system of etching agents being nitrogen-free and including one or more fluorine-containing compounds, an inert carrier gas and chlorine.

14. The method of claim 13, wherein the organic ARC consists essentially of polyimide.

15. The method of claim 13, wherein the plasma generating device is evacuated to a pressure below 40 mTorr while etching the ARC with the etching agents.

16. The method of claim 13, wherein the one or more fluorine-containing compounds is trifluoromethane and the inert carrier gas is argon.

17. The method of claim 16, carried out within the following window

Pressure—about 1 to about 100 millitorr
Temperature—about 30° to about 80° C.
$Cl_2$ flow—about 5 to about 60 sccm
Ar flow—about 5 to about 80 sccm
$CHF_3$ flow—about 5 to about 80 sccm.

18. A process for etching a pattern of exposed areas of an organic ARC, comprising exposing the ARC to an oxygen-free system of etching agents in an ionized state in a reaction chamber of a plasma generating device, the system of etching agents being nitrogen-free and including one or more fluorine-containing compounds, chlorine, and an inert carrier gas, wherein a photoresist layer forming the pattern of exposed area is disposed on the organic ARC, and wherein the organic ARC is selectively etched and the photoresist is substantially preserved such that lateral degradation of the photoresist layer forming the pattern of exposed areas is substantially prevented.

* * * * *